(12) United States Patent
Lee et al.

(10) Patent No.: US 8,225,031 B2
(45) Date of Patent: Jul. 17, 2012

(54) MEMORY MODULE INCLUDING ENVIRONMENTAL OPTIMIZATION

(75) Inventors: Teddy Lee, Roseville, CA (US); Lidia Warnes, Roseville, CA (US); Dan Vu, Elk Grove, CA (US); Dennis Carr, Roseville, CA (US); Michael Bozich Calhoun, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 864 days.

(21) Appl. No.: 12/262,063

(22) Filed: Oct. 30, 2008

(65) Prior Publication Data

US 2010/0115180 A1  May 6, 2010

(51) Int. Cl.
*G06F 11/30*  (2006.01)

(52) U.S. Cl. ...... 711/105; 365/51; 365/211; 365/233.13

(58) Field of Classification Search ............... None
See application file for complete search history.

(56) References Cited

U.S. PATENT DOCUMENTS

| 2006/0077758 | A1 | 4/2006 | Focke et al. |
| 2006/0083093 | A1 | 4/2006 | Dover et al. |
| 2006/0149996 | A1 | 7/2006 | Janzen et al. |
| 2006/0233025 | A1 | 10/2006 | Janzen et al. |
| 2007/0058470 | A1 | 3/2007 | Nierle et al. |
| 2007/0220228 | A1 | 9/2007 | Huang |
| 2008/0059690 | A1 | 3/2008 | Mittal et al. |
| 2008/0082767 | A1 | 4/2008 | Nulkar et al. |
| 2008/0130343 | A1 | 6/2008 | Janzen et al. |
| 2009/0034342 | A1 | 2/2009 | Miyamoto et al. |

FOREIGN PATENT DOCUMENTS

KR  10 2008/0095298  10/2008

OTHER PUBLICATIONS

Simmtester.com "Understanding DDR3 Serial Presence Detect (SPD) Table," Jul. 17, 2007, CST Publications. 15 pages.*
"Intel Extreme Memory Profile (XMP): Enthusiast Extension to the JEDEC DDR3 SPD Specification," Oct. 2007, Intel, Rev. 1. 32 pages.*
"SPD's for DDR SDRAM," JEDEC 21-C 4.01.02 04R13, Appendix D, Rev. 1.0. Published Jan. 2004. 39 pages.*
"Serial Presence Detect (SPD) for Fully Buffered DIMM," JEDEC 21-C 4.01.02 07R16A, Appendix X, Rev. 1.1. Published Jun. 2006. 47 pages.*
"Serial Presence Detects for DDR2 SDRAM," JEDEC 21-C 4.01.02 10R17, Annex J, Rev. 1.3. Published Jan. 2007. 60 pages.*
"NXP SO-DIMM and RDIMM temperature sensors SE97 and SE98: High-precision temp sensors for use with DDR2 and DDR3 DIMMS," NXP products leaflet, published May 2007. 2 pages.*

* cited by examiner

Primary Examiner — Alexander Sofocleous

(57) ABSTRACT

A memory apparatus enable operation which is adapted to environmental conditions. The memory apparatus includes a memory module that can store and incorporate environment-dependent optimal operating parameters. The memory module comprises a plurality of volatile memory devices and one or more non-volatile memory devices that store a plurality of environment-dependent device parameters for a device selected from the plurality of volatile memory devices. The stored parameters enable the selected device to function optimally in multiple environmental conditions.

13 Claims, 4 Drawing Sheets

| SPEED | VOLTAGE | TEMP | Trp | Trcd | Tras | Tcl |
|---|---|---|---|---|---|---|
| 1333 | 1.65 | 55-80 | 9 | 9 | 9 | 4 |
|  | 1.65 | 0-55 | 8 | 8 | 8 | 3 |
|  | 1.5 | 55-80 | 9 | 9 | 9 | 3 |
|  | 1.5 | 0-55 | 8 | 8 | 8 | 3 |
|  | 1.35 | 55-80 | - | - | - | - |
|  | 1.35 | 0-55 | - | - | - | - |
| 1067 | 1.65 | 55-80 | 8 | 8 | 8 | 3 |
|  | 1.65 | 0-55 | 6 | 6 | 6 | 4 |
|  | 1.5 | 55-80 | 9 | 9 | 9 | 3 |
|  | 1.5 | 0-55 | 8 | 8 | 8 | 4 |
|  | 1.35 | 55-80 | 9 | 9 | 9 | 3 |
|  | 1.35 | 0-55 | 8 | 8 | 8 | 4 |
| 800 | 1.65 | 55-80 | 6 | 6 | 6 | 4 |
|  | 1.65 | 0-55 | 7 | 7 | 7 | 3 |
|  | 1.5 | 55-80 | 7 | 7 | 7 | 3 |
|  | 1.5 | 0-55 | 7 | 7 | 7 | 4 |
|  | 1.35 | 55-80 | 8 | 8 | 8 | 3 |
|  | 1.35 | 0-55 | 8 | 8 | 8 | 2.5 |

| SPEED | VOLTAGE | TEMP | Trp | Trcd | Tras | Tcl |
|---|---|---|---|---|---|---|
| 1333 | 1.65 | 55-80 | 9 | 9 | 9 | 4 |
| | 1.65 | 0-55 | 8 | 8 | 8 | 3 |
| | 1.5 | 55-80 | 9 | 9 | 9 | 3 |
| | 1.5 | 0-55 | 8 | 8 | 8 | 3 |
| | 1.35 | 55-80 | - | - | - | - |
| | 1.35 | 0-55 | - | - | - | - |
| 1067 | 1.65 | 55-80 | 8 | 8 | 8 | 3 |
| | 1.65 | 0-55 | 6 | 6 | 6 | 4 |
| | 1.5 | 55-80 | 9 | 9 | 9 | 3 |
| | 1.5 | 0-55 | 8 | 8 | 8 | 4 |
| | 1.35 | 55-80 | 9 | 9 | 9 | 3 |
| | 1.35 | 0-55 | 8 | 8 | 8 | 4 |
| 800 | 1.65 | 55-80 | 6 | 6 | 6 | 4 |
| | 1.65 | 0-55 | 7 | 7 | 7 | 3 |
| | 1.5 | 55-80 | 7 | 7 | 7 | 3 |
| | 1.5 | 0-55 | 7 | 7 | 7 | 4 |
| | 1.35 | 55-80 | 8 | 8 | 8 | 3 |
| | 1.35 | 0-55 | 8 | 8 | 8 | 2.5 |

FIG. 4

MEMORY MODULE INCLUDING ENVIRONMENTAL OPTIMIZATION

BACKGROUND

A dual in-line memory module (DIMM) comprises a series of dynamic random access memory integrated circuits. The modules are mounted on a printed circuit board and designed for use in personal computers, workstations, servers, and other systems. For various technologies, various bus and device clock frequencies are standardized.

A DIMM's capacity and timing parameters may be identified with Serial Presence Detect (SPD), generally an additional integrated circuit chip which contains information about the module type.

Conventional DIMM SPD registers only contain operating parameters that are specific to one voltage, frequency, and temperature. Joint Electron Device Engineering Council (JEDEC) standard 79-3A (DDR3 SDRAM Specification, September 2007) specifies operating parameters that are frequency dependent, but parameters for only one frequency (a "speed-bin") are supported in the SPD register. If desired to operate a DIMM at a slower speed than the DIMM's design speed, a conventional system enables hard-coding into system firmware of relevant operating parameters obtained from system tests at a voltages, frequencies, or temperatures that are different from conditions at which the memory, for example DRAM (dynamic random access memory), is tested. Such hard-coding of system firmware generally adds firmware complexity for selecting operating parameters that are optimal for multiple types of DIMMs, voltages, frequencies, and temperatures. Furthermore, hard-coding of system firmware can lead to unpredictable performance since different system designers can program different custom values for the parameters. Each system integrator may test the memory at a variety of different speeds and settings to determine the optimal settings for each configuration. Unfortunately, such testing involves a long process for each integrator and any information attained is not available to all users of the DIMM. Additionally, the information is not stored with the part but instead in a separate location on each system that would have to be updated regularly as new parts become available. No standardization exists for determining timings for parts running at a frequency different than the vendor-specified frequency.

SUMMARY

Embodiments of a memory apparatus enable operation adapted to environmental conditions. The memory apparatus includes a memory module that can store and incorporate environment-dependent optimal operating parameters. The memory module comprises a plurality of volatile memory devices and one or more non-volatile memory devices that store a plurality of environment-dependent device parameters for a device selected from the plurality of volatile memory devices. The stored parameters enable the selected device to function optimally in multiple environmental conditions.

BRIEF DESCRIPTION OF THE DRAWINGS

Embodiments of the invention relating to both structure and method of operation may best be understood by referring to the following description and accompanying drawings:

FIG. 4 is an example table showing environment-dependent device parameters that can be stored an embodiment of a memory apparatus or system.

DETAILED DESCRIPTION

Embodiments of systems, memory systems, and methods for manufacturing such systems implement environment-dependent optimal operating parameters.

Environment-dependent optimal operating parameters for memory modules and systems can be programmed to simplify firmware complexity, lower overall system cost, reduce time-to-market, and increase compatibility of industry-standard parts. In a specific embodiment, environment-dependent operating parameters such as column address select (CAS) latencies (CL), write latencies (WL), and the like can be programmed for dual in-line memory modules (DIMMs) into a serial presence detect (SPD) register.

The embodiments of systems, memory modules, and associated operating techniques described herein implement environment-dependent optimal operating parameters to enable the automation of a system for optimizing the slower-speed performance of low-cost, high-volume DIMMs (dual in-line memory module) that are designed and specified to operate at a higher speed. Memory designed to operate at high bandwidth and relatively longer latencies (for example, 1333 mega transfers per second (MT/s) and 9-9-9 timing, signifying Column Address Strobe Latency (tCL)—RAS to CAS Delay (tRCD)—RAS precharge (tRP) timing) does not necessarily operate correctly with the same latency at a lower bandwidth (for example, 800 MT/s may be best with 7-7-7 timing). In some systems, a memory controller can be configured for a slower operating frequency than the low-cost, high-volume DIMMs that are supplied with the system. However, the DIMM only provides timing information on one bandwidth (the fastest operating speed of the DIMM) in the SPD, and the system has no a priori information to determine timings to use for slower operation. Some operating parameters are dependent on voltage, frequency, and temperature that can be optimized for performance, cooling, and power.

The illustrative configuration that supports environment-dependent optimal operating parameters enables industry standard DIMMs to be used in a wider range of systems than the environment (voltage, frequency, temperature) at which the DIMMs were tested. Functional testing and DIMM qualifications are simplified, which decreases the time-to-market for a given system.

Figure 1:
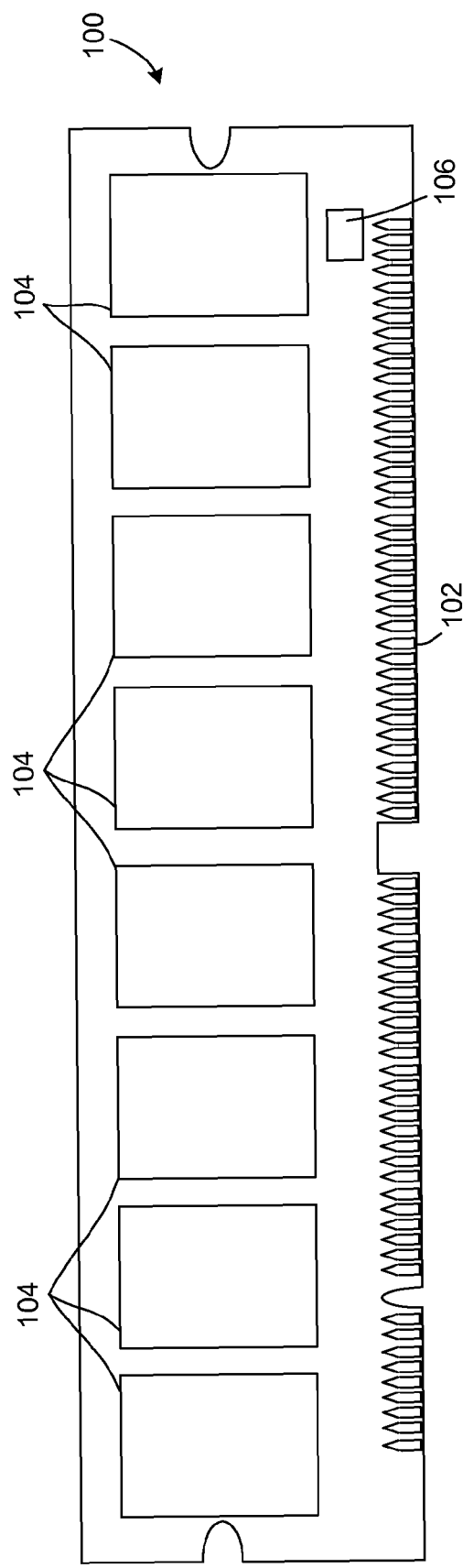
FIG. 1 is a schematic pictorial diagram depicting an embodiment of a memory apparatus that enables operation adapted to environmental conditions.

Referring to FIG. 1, a schematic pictorial diagram illustrates an embodiment of a memory apparatus 100 that enables operation which is adapted to environmental conditions. The memory apparatus 100 includes a memory module 102 that can store and incorporate environment-dependent optimal operating parameters. The memory module 102 comprises a plurality of volatile memory devices 104 and one or more non-volatile memory devices 106 that store a plurality of environment-dependent device parameters for a device selected from the plurality of volatile memory devices 104. The stored parameters enable the selected device to function optimally in multiple environmental conditions.

The one or more non-volatile memory devices 104 store the plurality of environment-dependent device parameters for at least one of the plurality of volatile memory devices 104. The device parameters uniquely correspond to multiple environmental conditions for individual devices of the plurality of volatile memory devices 104.

In an example implementation, the parameters can be assigned to an individual volatile memory device for a range of supply voltages, operating frequencies, and temperatures. Examples of environment-dependent device parameters include column address select (CAS) latencies supported, CAS write latency, minimum row precharge time, minimum row active to row active delay, active to active or REF command period, minimum row address select (RAS)-to-CAS delay, minimum active to precharge time, internal read command to first data interval, and the like. A particular implementation of the memory apparatus 100 can support any number of selected parameters.

In an example application, the environment-dependent device parameters can be selected to enable optimization of slower-speed performance of dual in-line memory modules (DIMMs) that are specified to operate at a speed which is higher than the slower-speed.

In various applications, the environment-dependent device parameters can be selected for optimization of performance, cooling, and power for multiple applied voltages, operating frequencies, and operating temperature.

The volatile memory devices 104 and non-volatile memory devices 106 can be any suitable memory components and devices. In a specific example, the non-volatile memory device 106 can be an electrically-erasable programmable read-only memory (EEPROM) that supports serial presence detect (SPD) with SPD memory space allocated to include the environment-dependent device parameters. The memory module 102 can be a dual in-line memory module (DIMM) with multiple mounted dynamic random access memory (DRAM) integrated circuits.

Figure 2:
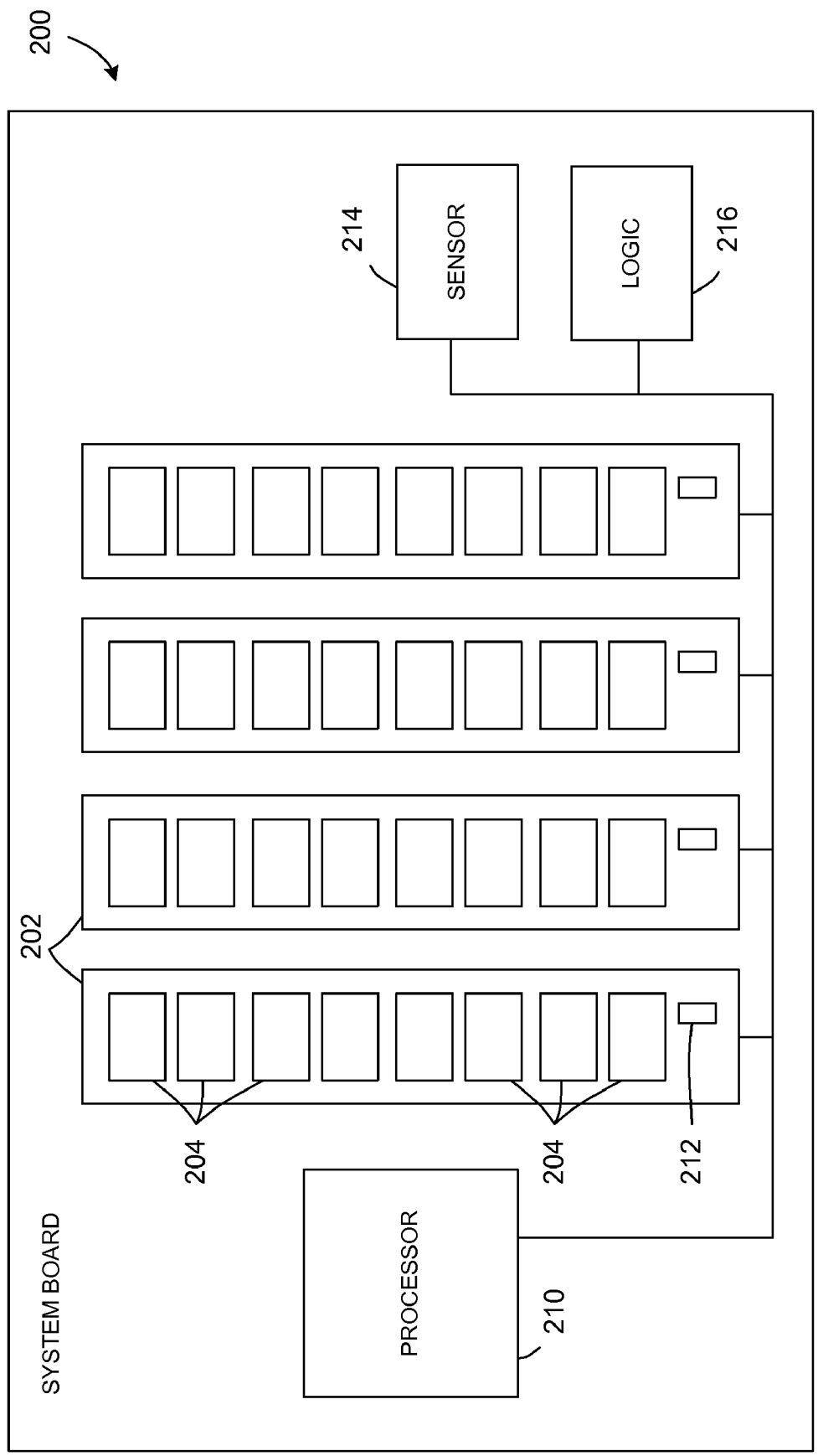
FIG. 2 is a schematic block diagram showing an embodiment of a system that operates memory based on environmental conditions.

Referring to FIG. 2, a schematic block diagram illustrates an embodiment of a system 200 that operates memory based on environmental conditions. The illustrative system 200 comprises a processor 210 and a memory module 202 coupled to the processor 210. The illustrative memory module 202 comprises a plurality of memory devices 204 and parameters database 212 which stores multiple environment-dependent device parameters for individual devices of the plurality of memory devices 204. The parameters enable the individual device to function optimally in multiple environmental conditions.

The memory devices 204 can be any suitable type of device. For example, the memory devices 204 can be dynamic random access memory (DRAM) devices.

The parameters database 212 stores the multiple environment-dependent device parameters for at least one of the plurality of memory devices 204. The device parameters uniquely corresponding to a multiple environmental conditions for a single device of the memory device plurality. The environment-dependent device parameters can be assigned to an individual memory device 204 for a range of supply voltages, operating frequencies, temperatures, and the like. In an example implementation, parameters can be selected from among column address select (CAS) latencies supported, CAS write latency, minimum row precharge time, minimum row active to row active delay, active to active or REF command period, minimum row address select (RAS)-to-CAS delay, minimum active to precharge time, internal read command to first data interval, and others.

The stored environment-dependent device parameters enable tailoring of operations to environmental conditions to enable optimization of aspects of operation including performance, cooling, and power for a plurality of applied voltages, operating frequencies, operating temperature, and the like. For example, the parameters can be selected to enable optimization of slower-speed performance of dual in-line memory modules (DIMMs) that are specified to operate at a speed higher than the slower-speed.

The system 200 can comprise a plurality of memory modules 202 coupled to the processor 210 with the memory modules 202 having at least some variability in environment-dependent device parameters. The processor 210 operates to compare the parameters database 212 programmed for the different memory modules 202 and determine optimal settings that enable the multiple memory modules 202 to operate at a maximum supported speed with parameters that all memory modules 202 are qualified to operate.

Various embodiments can incorporate any suitable components and devices. In a particular example implementation, the memory module 202 can be a dual in-line memory module (DIMM), the memory devices 204 can be dynamic random access memory (DRAM) integrated circuits mounted on the memory module 202, and the parameters database 212 can be an electrically-erasable programmable read-only memory (EEPROM) that supports serial presence detect (SPD) wherein SPD memory space is allocated to include the plurality of environment-dependent device parameters.

The system 200 can further comprise at least one sensor 214 that senses an environmental condition, and logic 216 coupled to the sensor and the memory module 202 that invokes a parameter set from the multiple environment-dependent device parameters based on the sensed environmental condition.

Figure 3:
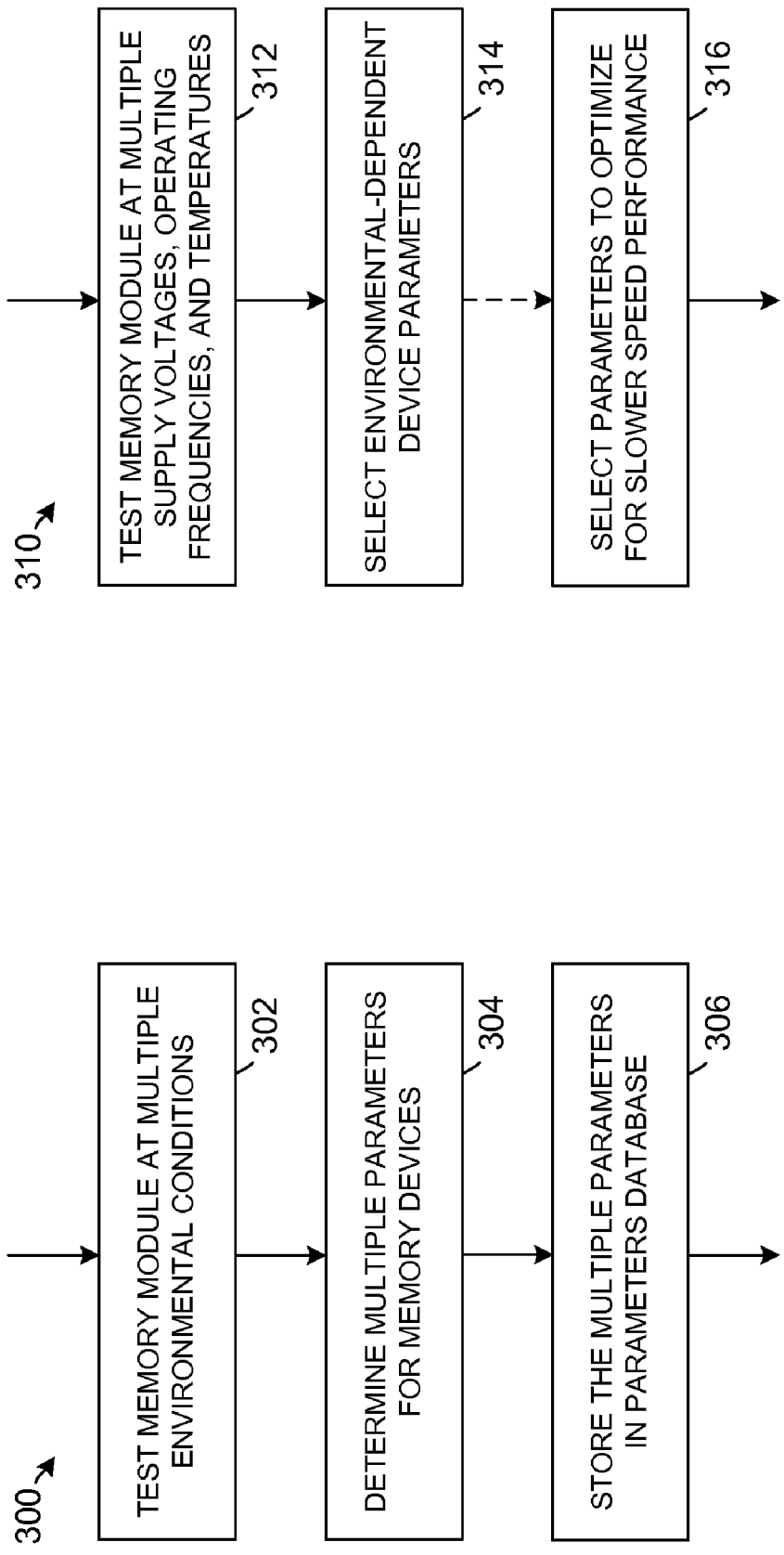
FIGS. 3A and 3B are flow charts illustrating one or more embodiments or aspects of a method for manufacturing a memory apparatus that enables operation which is adapted to environmental conditions.

Referring to FIGS. 3A and 3B, flow charts illustrate one or more embodiments or aspects of a method for manufacturing a memory apparatus that enables operation which is adapted to environmental conditions. FIG. 3A depicts a method for manufacturing 300 a memory apparatus that can store and incorporate environment-dependent optimal operating parameters. The illustrative method 300 comprises testing 302 a memory module at multiple environmental conditions and determining 304 a plurality of environment-dependent device parameters for operating memory devices in the memory module at the multiple environmental conditions. The plurality of environment-dependent device parameters are stored 306 in a parameters database. The environment-dependent device parameters enable the memory devices to function optimally in multiple environmental conditions.

FIG. 3B shows an embodiment of a manufacturing method 310 that supports operation of the memory apparatus which is adapted for environmental conditions. The method 310 comprises testing 312 the memory module at a range of supply voltages, operating frequencies, and temperatures. The environment-dependent device parameters can be selected 314 from column address select (CAS) latencies supported, CAS write latency, minimum row precharge time, minimum row active to row active delay, active to active or REF command period, minimum row address select (RAS)-to-CAS delay, minimum active to precharge time, internal read command to first data interval, and others.

In some implementations, the environment-dependent device parameters can be selected 316 to enable optimization of slower-speed performance of dual in-line memory modules (DIMMS) that are specified to operate at a speed higher than the slower-speed.

Referring to FIG. 4, an example table shows environment-dependent device parameters that can be stored an embodiment of a memory apparatus or system. An illustrative memory apparatus or system enables programming of multiple operating parameters into the SPD register of a given DIMM. Optimal operating parameters are supplied for a range of voltages, frequencies, and temperatures. Relevant operating parameters that may vary with the system environment may include but are not limited to CL: CAS latencies supported; CWL: CAS write latency; t_RP: minimum row precharge time; t_RRD: minimum row active to row active delay; t_RC: active to active or REF command period; t_RCD: minimum RAS-to-CAS delay; t_RAS: minimum active to precharge time; t_AA: internal read command to first data; and the like.

In the example, the space requirements in SPD EEPROM are allocated for four 4 speed grades times three voltages times two temperatures for a total of 24 settings in the SPD. Each setting is four 4-bit values, for a total of 48 bytes per table. In the example, the size of the table in non-volatile memory is given as 24 bytes for illustrative purposes only. In a particular implementation, any suitable size can be used since the range of possible values can be smaller or much larger.

In the example table, two rows for the highest speed operation are shown as blank. The concept is that a module can also contain information designating speeds at which the module is not designed to operate. Although shown as blank, the corresponding memory or logic for the blank elements is programmed or set to hold a value that indicates to the system either to prohibit running of the memory at that speed, or to expect failures and/or marginal behavior at the speed.

The table depicted in FIG. 4 illustrates one embodiment of environment-dependent device parameters that can be stored in a system or memory device. Any suitable combination of parameters can be implemented in other configurations.

The systems, devices, and manufacturing techniques disclosed herein can eliminate the testing of systems to obtain operating parameters, thereby decreasing the time-to-market for a given system. System cost is reduced by enabling the use of high-volume parts in a system. Firmware complexity is also reduced because the SPD already contains operating parameters for a range of system environments. The correct operating parameters may be selected by reading the SPD register information from the DIMM. By testing the DIMMs at different frequencies, voltages, and temperatures, then supplying that information in the SPD, memory vendors can expect wider usage of parts that are designed to run at a higher frequency than system integrators desire. Support of environment-dependent device parameters enables the depicted systems and devices to store significantly less information about the memory used in the system by locating storage of the timing information directly on the DIMM. Improvements in memory process technology that allow higher speed operation can be exploited in a system that supports environment-dependent device parameters to enable memory to be transparently utilized by systems that read data from the SPD.

Terms "substantially", "essentially", or "approximately", that may be used herein, relate to an industry-accepted tolerance to the corresponding term. Such an industry-accepted tolerance ranges from less than one percent to twenty percent and corresponds to, but is not limited to, functionality, values, process variations, sizes, operating speeds, and the like. The term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. Inferred coupling, for example where one element is coupled to another element by inference, includes direct and indirect coupling between two elements in the same manner as "coupled".

The illustrative block diagrams and flow charts depict process steps or blocks in a manufacturing process. Although the particular examples illustrate specific process steps or acts, many alternative implementations are possible and commonly made by simple design choice. Acts and steps may be executed in different order from the specific description herein, based on considerations of function, purpose, conformance to standard, legacy structure, and the like.

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims.

What is claimed is:

1. A memory apparatus comprising:
   a memory module comprising:
      a plurality of volatile memory devices;
      at least one non-volatile memory device that stores a plurality of sets of environment-dependent device operating parameters for an individual device of the plurality of volatile memory devices, the plurality of sets of parameters enabling the individual device to function optimally in multiple environmental conditions, the multiple environmental conditions including supply voltages, operating frequencies, and temperatures; and
   wherein the module is configured to receive an invocation of one of the plurality of sets of environment-dependent device operating parameters based on a supply voltage, an operating frequency, and a sensed temperature.

2. The apparatus according to claim 1 further comprising:
   the at least one non-volatile memory device storing the plurality of sets of environment-dependent device operating parameters for at least one of the plurality of volatile memory devices, the device operating parameters uniquely corresponding to a plurality of environmental conditions for ones of the plurality of volatile memory devices.

3. The apparatus according to claim 1 further comprising:
   the plurality of sets of environment-dependent device operatin parameters assigned to an individual volatile memory device for a range of supply voltages, operating frequencies, and temperatures;
   the plurality of sets of environment-dependent device operating parameters comprising at least one parameter selected from a group consisting of column address select (CAS) latencies supported, CAS write latency, minimum row precharge time, minimum row active to row active delay, active to active or REF command period, minimum row address select (RAS)-to-CAS delay, minimum active to precharge time, and internal read command to first data interval; and the plurality of sets of environment-dependent device parameters selected for optimization of performance, cooling, and power for a plurality of applied voltages, operating frequencies, and operating temperature.

4. The apparatus according to claim 1 further comprising:
the plurality of sets of environment-dependent device parameters selected to enable optimization of slower-speed performance of dual in-line memory modules (DIMMs) that are specified to operate at a speed higher than the slower-speed.

5. The apparatus according to claim 1 further comprising:
the at least one non-volatile memory device comprising an electrically-erasable programmable read-only memory (EEPROM) that supports serial presence detect (SPD) wherein SPD memory space is allocated to include the plurality of sets of environment-dependent device parameters.

6. The apparatus according to claim 1 further comprising:
the memory module comprising a dual in-line memory module (DIMM) with a plurality of dynamic random access memory (DRAM) integrated circuits mounted thereon.

7. A system comprising:
logic;
a temperature sensor coupled to the logic to sense a temperature; and
a memory module coupled to the logic and comprising a plurality of memory devices and a parameters database that stores a plurality of sets of environment-dependent device parameters for an individual device of the plurality of memory devices, the plurality of sets of parameters enabling the individual device to function optimally in multiple environmental conditions, the multiple environmental conditions including a range of supply voltages, operating frequencies, and temperatures;
wherein the logic is configured to invoke one of the plurality of sets of environment-dependent device operating parameters based on a supply voltage, an operating frequency, and the sensed temperature.

8. The system according to claim 7 further comprising:
the plurality of memory devices comprising dynamic random access memory devices.

9. The system according to claim 7 further comprising:
the parameters database storing the plurality of sets of environment-dependent device parameters for at least one of the plurality of memory devices, the device parameters uniquely corresponding to a plurality of environmental conditions for ones of the plurality of memory devices; and
the plurality of sets of environment-dependent device parameters assigned to an individual memory device for a range of supply voltages, operating frequencies, and temperatures.

10. The system according to claim 7 further comprising:
a processor; and
a plurality of memory modules coupled to the processor having at least some variability in environment-dependent device parameters, the processor operative to compare the parameters database programmed for different ones of the memory modules and determine optimal settings that enable the plurality of memory modules to operate at a maximum supported speed and with parameters that all memory modules are qualified to operate.

11. The system according to claim 7 further comprising:
the plurality of sets of environment-dependent device parameters comprising at least one parameter selected from a group consisting of column address select (CAS) latencies supported, CAS write latency, minimum row precharge time, minimum row active to row active delay, active to active or REF command period, minimum row address select (RAS)-to-CAS delay, minimum active to precharge time, and internal read command to first data interval;
the plurality of sets of environment-dependent device parameters selected to enable optimization of slower-speed performance of dual in-line memory modules (DIMMs) that are specified to operate at a speed higher than the slower-speed; and
the plurality of sets of environment-dependent device parameters selected for optimization of performance, cooling, and power for a plurality of applied voltages, operating frequencies, and operating temperature.

12. The system according to claim 7 further comprising:
the parameters database comprising an electrically-erasable programmable read-only memory (EEPROM) that supports serial presence detect (SPD) wherein SPD memory space is allocated to include the plurality of environment-dependent device parameters;
the memory module comprising a dual in-line memory module (DIMM); and
the plurality of memory devices comprises a plurality of dynamic random access memory (DRAM) integrated circuits mounted on the memory module.

13. The system according to claim 7 further comprising:
the logic configured to invoke the one of the plurality of sets of environment-dependent device operating parameters automatically.

* * * * *

UNITED STATES PATENT AND TRADEMARK OFFICE
CERTIFICATE OF CORRECTION

PATENT NO.      : 8,225,031 B2
APPLICATION NO. : 12/262063
DATED           : July 17, 2012
INVENTOR(S)     : Teddy Lee et al.

Page 1 of 1

It is certified that error appears in the above-identified patent and that said Letters Patent is hereby corrected as shown below:

In column 6, line 40, in Claim 1, before "supply" insert -- a range of --.

In column 6, line 56, in Claim 3, delete "operatin" and insert -- operating --, therefor.

Signed and Sealed this
Twelfth Day of March, 2013

Teresa Stanek Rea
*Acting Director of the United States Patent and Trademark Office*